US008903465B2

(12) United States Patent
Huang et al.

(10) Patent No.: US 8,903,465 B2
(45) Date of Patent: Dec. 2, 2014

(54) SUPERCONDUCTING MAGNET ASSEMBLY AND FABRICATING METHOD

(75) Inventors: Xianrui Huang, Clifton Park, NY (US); Yan Zhao, Shanghai (CN); Anbo Wu, Shanghai (CN); Evangelos Trifon Laskaris, Schenectady, NY (US); Paul St. Mark Shadforth Thompson, Stephentown, NY (US)

(73) Assignee: General Electric Company, Schenectady, NY (US)

( * ) Notice: Subject to any disclaimer, the term of this patent is extended or adjusted under 35 U.S.C. 154(b) by 947 days.

(21) Appl. No.: 13/015,634

(22) Filed: Jan. 28, 2011

(65) Prior Publication Data

US 2012/0135868 A1 May 31, 2012

(30) Foreign Application Priority Data

Feb. 2, 2010 (CN) .......................... 2010 1 0115366

(51) Int. Cl.
*H01F 6/04* (2006.01)
*H01F 6/06* (2006.01)
*H01L 39/24* (2006.01)
*H01F 41/04* (2006.01)

(52) U.S. Cl.
CPC ................ *H01F 41/048* (2013.01); *H01F 6/04* (2013.01); *H01F 6/06* (2013.01); *Y10S 505/879* (2013.01)
USPC ........... 505/211; 505/163; 505/433; 505/879; 335/216; 29/599

(58) Field of Classification Search
CPC ........... H01F 6/04; H01F 6/06; H01F 41/048; H01L 39/24
USPC ................. 505/163, 211, 433, 705, 845, 879; 335/216; 324/318; 29/599; 174/125.1, 174/15.4, 15.5
See application file for complete search history.

(56) References Cited

U.S. PATENT DOCUMENTS 6,144,204 A 11/2000 Sementchenko
6,995,562 B2 2/2006 Laskaris et al.
7,069,195 B2 6/2006 Hasegawa (Continued)

FOREIGN PATENT DOCUMENTS

CN 101577166 A 11/2009
EP 0667628 A1 8/1995

(Continued)

OTHER PUBLICATIONS

Search Report from corresponding GB Application No. GB1101325.7 dated May 16, 2011.

(Continued)

*Primary Examiner* — Stanley Silverman
*Assistant Examiner* — Kallambella Vijayakumar
(74) *Attorney, Agent, or Firm* — GE Global Patent Operation; Marc A. Vivenzio

(57) ABSTRACT

A superconducting magnet assembly includes a bobbin comprising a central bore along a longitudinal direction, and a superconducting coil package wound on the bobbin. The superconducting coil package includes a plurality of superconducting coil layers wound on the bobbin, a plurality of supporting member layers, each of the supporting member layers being between a corresponding two adjacent superconducting coil layers, and a thermal conduction layer between two superconducting coil layers or between a superconducting coil layer and an adjacent supporting member layer.

19 Claims, 6 Drawing Sheets

(56) References Cited

U.S. PATENT DOCUMENTS

| | | | | |
|---|---|---|---|---|
| 7,212,004 | B2 | 5/2007 | Doddrell et al. | |
| 7,498,814 | B1 * | 3/2009 | Huang et al. | 324/318 |
| 7,522,027 | B2 | 4/2009 | Calvert et al. | |
| 7,616,083 | B2 * | 11/2009 | Gilgrass | 335/216 |
| 2007/0257754 | A1 | 11/2007 | Gilgrass | |

FOREIGN PATENT DOCUMENTS

| | | | | | |
|---|---|---|---|---|---|
| EP | 0602647 | A1 | | 6/2007 | |
| GB | 1103009 | A | | 2/1968 | |
| GB | 1262902 | | * | 2/1972 | H01F 7/02 |
| GB | 1262902 | A | | 2/1972 | |
| GB | 2432259 | | * | 5/2007 | H01F 6/06 |
| GB | 2432259 | A | | 5/2007 | |
| GB | 2432725 | A1 | | 5/2007 | |
| GB | 2432898 | A | | 6/2007 | |
| JP | 04188707 | A | | 7/1992 | |
| JP | 09148123 | | * | 6/1997 | H01F 6/06 |
| JP | 09148123 | A | | 6/1997 | |
| JP | 10116725 | | * | 5/1998 | H01F 6/04 |
| JP | 10116725 | A | | 5/1998 | |
| JP | 11135318 | A | | 5/1999 | |
| JP | 2004259737 | A | | 9/2004 | |
| JP | 2009188109 | A | | 8/2009 | |

OTHER PUBLICATIONS

Examination Report from corresponding GB1101325.7 dated Jul. 17, 2012.

* cited by examiner

SUPERCONDUCTING MAGNET ASSEMBLY AND FABRICATING METHOD

BACKGROUND OF THE INVENTION

1. Field of the Invention

Embodiments of the invention relate generally to superconducting magnet assemblies and fabricating methods.

2. Description of the Prior Art

Superconducting magnets comprise superconducting coils conducting electricity without resistance as long as the magnets are maintained at a suitably low temperature, which is referred to as "superconducting temperature" hereinafter. Accordingly, when a power source is initially coupled to the superconducting coils, electrical current continues to flow through the coils even after the power is removed resulting in a strong magnetic field being maintained. Superconducting magnet are used in, for example, a Magnetic Resonance Imaging (MRI) systems, to generate a strong, uniform magnetic fields within which a patient or other subject is placed.

A superconducting magnet assembly usually comprises several superconducting coils wound on a bobbin for example, and a cooling system for cooling the superconducting coils at the superconducting temperature. When an electrical current is applied to the magnetic coils, known as a ramp-up, magnetic forces act on the magnetic coils, and the coils have a tendency to move and deform under the forces. When the current is removed from the coils, the forces diminish, and the coils will tend to return to their original positions. A small shift in the relative position of the coils can significantly impact the quality of the magnetic field produced by the magnet. The magnetic forces exert stresses and strains on the coils, excessive stresses or strains may cause the coil to break or become damaged. Further, excessive stresses or strains may cause cracking or frictional movements in the coils, which raise the coil temperature to exceed the superconducting temperature and quench the magnet. Accordingly, mechanical support arrangements are needed for securing the coils in place, and for bearing strains and stresses on the coils which are generated by the magnetic forces.

One conventional mechanical support arrangement comprises a plurality of support members mechanically securing the corresponding magnetic coils on the bobbin, which adversely make the assembly very complicated and bulky.

It is desirable to have a different and a simpler superconducting magnet assembly and method with mechanical support arrangements for superconducting coils.

SUMMARY OF THE INVENTION

In accordance with an embodiment disclosed herein, a superconducting magnet assembly includes a bobbin comprising a central bore along a longitudinal direction, and a superconducting coil package wound on the bobbin. The superconducting coil package includes a plurality of superconducting coil layers wound on the bobbin, a plurality of supporting member layers, each of the supporting member layers being between a corresponding two adjacent superconducting coil layers, and a thermal conduction layer between two superconducting coil layers or between a superconducting coil layer and an adjacent supporting member layer.

In accordance with another embodiment disclosed herein, a method includes winding a plurality of superconducting coil layers on a bobbin, winding a plurality of supporting member layers each between a corresponding two adjacent superconducting coil layers; and winding a thermal conduction member between two adjacent superconducting coil layers.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Embodiments of the invention relate to a superconducting magnet assembly comprising a plurality of superconducting coil layers, a plurality of supporting member layers each between a corresponding two adjacent superconducting coils, and at least one thermal conduction member between two adjacent superconducting coil layers or between one superconducting coil layer and one adjacent supporting member layer. Embodiments of the invention also relate to a method of fabricating the superconducting magnet assembly.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation.

Figure 1:
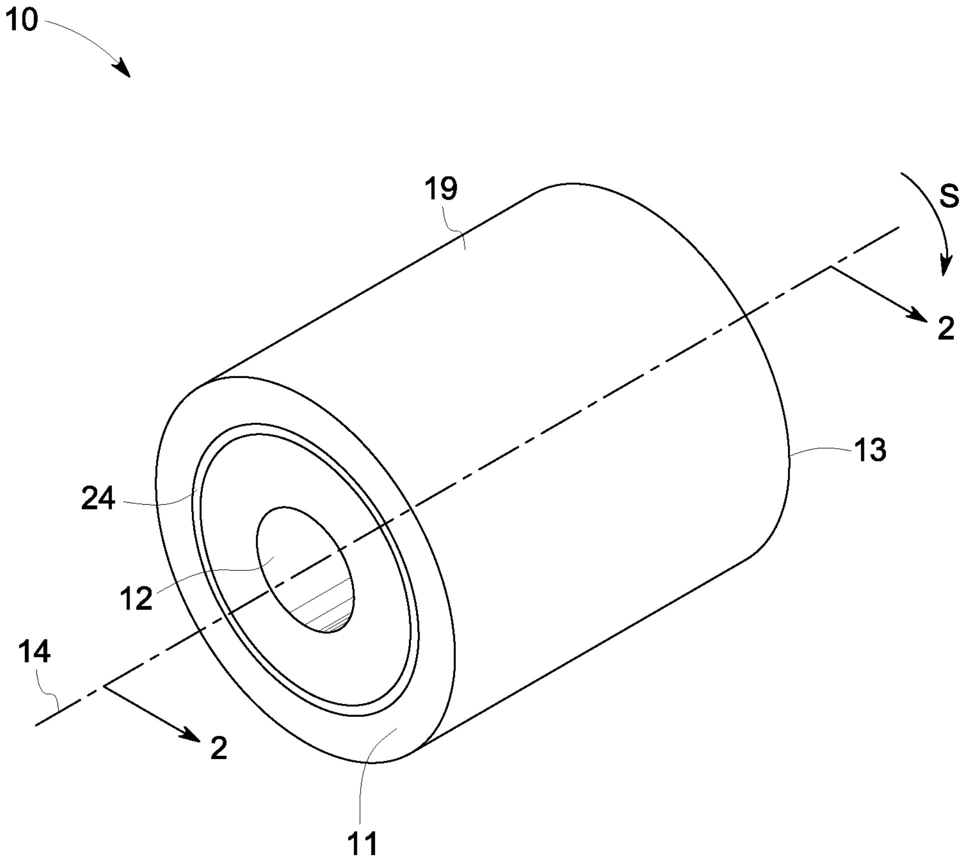
FIG. 1 is a perspective view of a superconducting magnet assembly according to one embodiment.

Referring to FIG. 1, a superconducting magnet assembly 10 according to one embodiment comprises a cylindrical shape. In the illustrated embodiment, the superconducting magnet assembly 10 defines a central bore 12 extending through a front and a rear surface 11, 13 thereof. The central bore 12 comprises a central axis 14 along the front-to-rear direction ("longitudinal direction").

Figure 2:
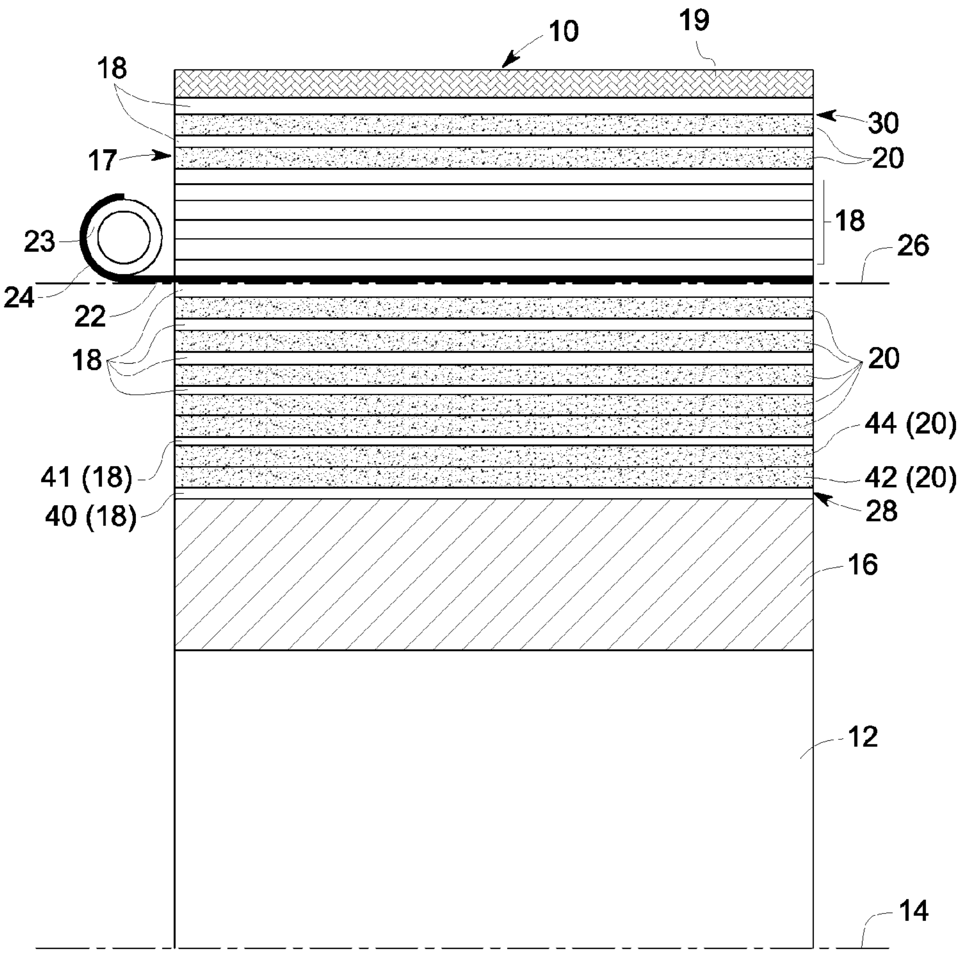
FIG. 2 is a cross-sectional view of an upper half of the superconducting magnet assembly along line 2-2 in FIG. 1.

FIG. 2 is a cross-sectional view of an upper half of the superconducting magnet assembly 10 along line 2-2 in FIG. 1. A lower half the superconducting magnet assembly 10 is symmetrical to the upper half, and is omitted from FIG. 2 for purpose of simplification of the view. In the illustrated embodiment, the superconducting magnet assembly 10 comprises a cylindrical bobbin 16 which defines the central bore 12, and a superconducting coil package 17 wound on the bobbin 16. In certain embodiments, the bobbin 16 may be made of electrically non-conductive material, such as plastic, ceramic, and the like. In another embodiment, the bobbin 16 will be removed from the superconducting magnet assembly 10 after the coil package 17 is wound and cured. In the illustrated embodiment, the superconducting magnet assembly 10 further comprises an outer protection layer 19 circumferentially surrounding the superconducting coil package 17 for protecting the superconducting coil package 17. In one embodiment, the protection layer 19 may comprises steel, aluminum, or an alloy thereof for example.

In the illustrated embodiment, the superconducting coil package 17 comprises a plurality of superconducting coil layers 18 circumferentially wound on an outer surface of the bobbin 16 layer by layer, at least one supporting member layer 20 between two adjacent superconducting coil layers 18, and at least one thermal conduction member 22. In the embodiment illustrated in FIG. 2, the thermal conduction member 22 is located between two adjacent superconducting coil layers 18. In an alternative embodiment, the thermal conduction member 22 may be located between a superconducting coil layer 18 and a supporting member layer 20.

With continued reference to FIG. 2, in the illustrate embodiment, the superconducting magnet assembly 10 further comprises a cooling member 23 thermally coupled to the thermal conduction layer 22. The cooling member 23 is further thermally coupled with the superconducting coil layers 18 through the thermal conduction layer 22. In the illustrated embodiment, the cooling member 23 is a cooling tube for transmitting a liquid cryogen, such as liquid helium for example, used for cooling the superconducting coil layers 18. In the illustrated embodiment, the cooling member 23 is attached to the front surface 11 of the superconducting magnet assembly 10. In the illustrated embodiment, the thermal conduction member 22 comprises a circumferential joint portion 24 extending beyond the front surface 11 for thermally contacting the cooling member 23 (FIG. 1). In one embodiment, the joint portion 24 is curved and has an inner surface substantially matching an outer surface of the cooling member 23 to get a large thermal contact area between the thermal conduction layer 22 and the cooling member 23. In another embodiment, the cooling member 23 may be a thermal conduction member having one end coupled with the thermal conduction layer 22 and another end thermally coupled to a cryocooler.

In one embodiment, the superconducting coil layers 18 each comprise a plurality of winding turns formed, for example, by helically winding at least one superconducting coil on the bobbin 16, and adhesive materials, such as epoxy, applied on the winding turns for bonding the winding turns together. In certain embodiments, the superconducting coils may comprise NbTi, $Nb_3Sn$ or $MgB_2$ wires, or BSCCO or YBCO type high temperature superconducting materials.

In certain embodiments, the superconducting coils in the layers 18 carry electrical current, and an electromagnetic field is generated in the superconducting layers 18. Accordingly, electromagnetic forces are generated, which apply stresses and strains on the superconducting coils in the layers 18. In one embodiment, the supporting member layer 20 comprises materials with high modulus for reinforcing the stiffness of the superconducting coil layers 18 and for bearing the electromagnetic forces exerted on the superconducting coils in the layers 18. In one embodiment, the supporting member layers 20 comprise a fiber-glass material. Accordingly, stresses and strains on the superconducting coils, induced by electromagnetic forces, can be limited within the desired limits by placing enough supporting member layers 20 in the superconducting coil package 17.

In certain embodiments, the hoop stresses (s) and strains (e) in the superconducting coils can be obtained according to:

$$e=P*R/(E_w*A_w+E_s*A_s),$$

$$s=P*R/(A_w+A_s*E_s/E_w),$$

wherein "P" is the electromagnetic pressure exerted on the coils; "R" is the radius of the superconducting coils; $E_w$ and $E_s$ are the moduli of the superconducting coils and the supporting member layers 20 respectively; and $A_w$ and $A_s$ are the cross-sectional areas of the superconducting coil layers 18 and the supporting member layers 20 respectively. The electromagnetic pressure pushes the superconducting coils and the supporting member layers 20 together as an integrated structure. Accordingly, for a determined superconducting coil material and coil dimensions, by selecting proper thickness or dimension of the supporting member layers 20, the stresses (s) and strains (e) in the superconducting coil package 17 can be limited to a specified level.

In the illustrated embodiment, the superconducting coil package 17 has a middle circumference plane 26 which divides the superconducting coil package 17 into an inner part 28 which is adjacent to the bobbin 16, and an outer part 30 farther from the bobbin 16 as compared with the inner part 28. The inner and outer parts 28, have about the same thickness along a radial direction of the superconducting magnet assembly 10. In certain embodiments, when the superconducting coils in different superconducting coil layers 18 all carry the same electrical current, the superconducting magnetic assembly 10 has a peak magnetic field at the magnetic coil layers 18 of the inner part 28 and adjacent to the bobbin 16. Since the superconducting coil's capacity of carrying electrical current is a function of the magnetic field, the peak magnetic field reduces the coils' capacity of carrying current. In the illustrated embodiment, the thickness of the supporting members 20 in the inner part 28 is designed to be larger than the thickness of the supporting members 20 in the outer part 30, diluting the current density of the inner part 28. Accordingly, the peak magnet field in the inner part 28 is reduced and the overall superconducting coils' capacity of the superconducting magnet 10 for carrying electrical current is increased.

In the illustrated embodiment, the superconducting magnet assembly 10 comprises a plurality of supporting member layers 20, and each supporting member layer 20 has the same thickness. The inner part 28 has more supporting member layers 20 than the outer part 30. In the illustrated embodiment, the superconducting coil package 17 comprises first and second superconducting coil layers 40, 41 which are closest to the bobbin 16, and comprises at least two supporting member layers 42, 44 between the first and second superconducting coil layers 40, 41. In another embodiment which is not shown, the supporting member layers may have different thickness, and one supporting member layer in the inner part 28 may have a larger thickness than one supporting member layer in the outer part 30.

In certain embodiments, the thermal conductive layer 22 comprises high thermal conductive materials, such as copper or aluminum, for example. In one embodiment, the thermal conduction layer 22 is substantially coincident with the middle circumference plane 26 where heat conduction lengths to the superconducting coil layers 18 are the shortest.

Figure 3:
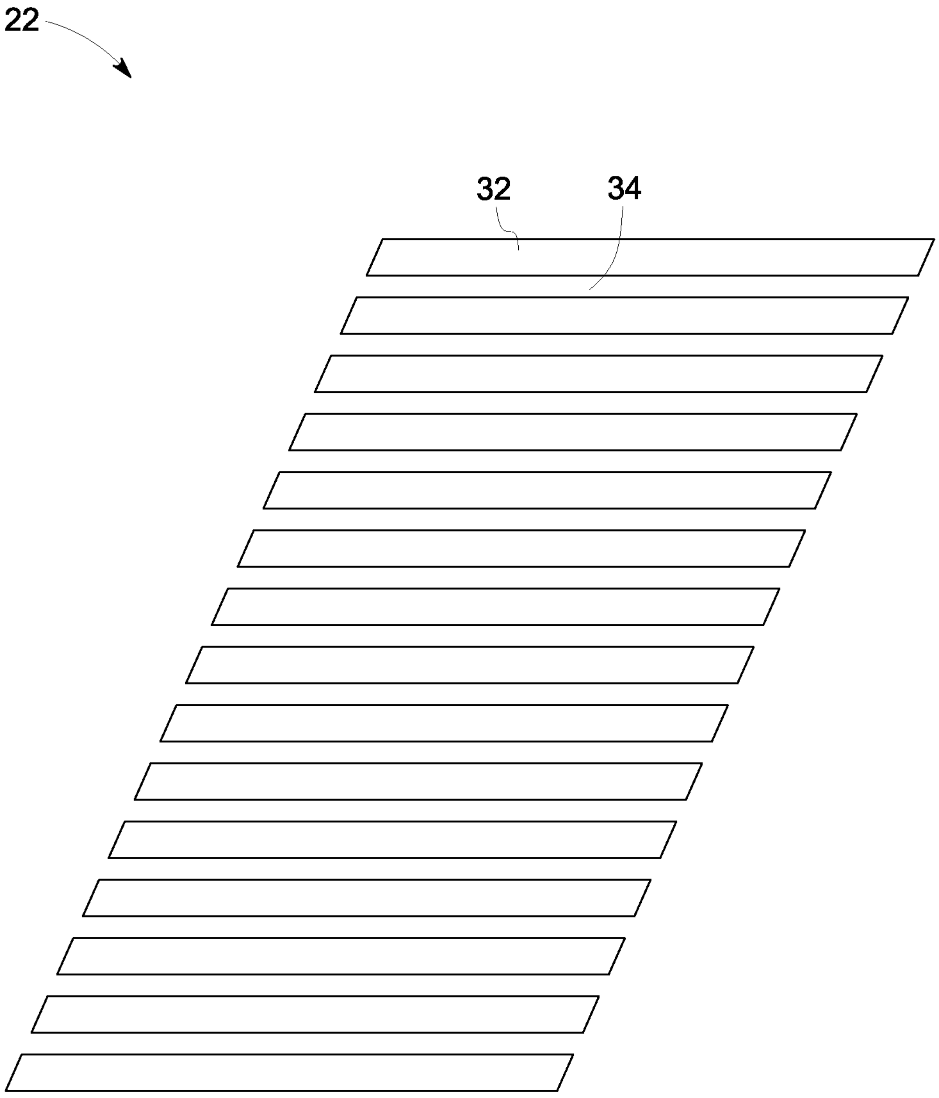
FIG. 3 is a perspective view of a thermal conduction member of the superconducting magnet assembly in FIG. 2 according to one embodiment.

FIG. 3 illustrates an exemplary thermal conduction layer before assembled to the superconducting magnet assembly 10. The illustrated thermal conductive layer 22 comprises a thermal conductive sheet, such as a copper sheet, which is flexible in the circumferential direction (FIG. 1) of the superconducting magnet assembly 10. In the illustrated embodiment, the thermal conductive layer 22 comprises a plurality of strips 32 extending along the longitudinal direction of the superconducting magnet assembly 10, and slits 34 between adjacent strips 32. In another embodiment, the thermal conduction layer 22 comprises joint portions (not shown) that that connect the strips 32. In still another embodiment, the thermal conductive layer 22 comprises at least one serpentined strip 32 for allowing extension along the circumferential direction. In still another embodiment, the thermal conductive layer 22 comprises a plurality of copper or aluminum wires or cables extending along the longitudinal direction of the assembly, and epoxy bonded to an adjacent superconducting coil layer 18 or an adjacent supporting member layer 20. During operation, heat of the superconducting coil layers 18 is radially conducted to the thermal conductive layer 22. The thermal conduction layer 22 is flexible in the circumferential direction, accordingly, very small shear stresses will be built up when the superconducting coils in the superconducting coil layers 18 expand under electromagnetic pressure, and no cracking and thermal disturbance occurs at the thermal conduction layer 22.

Figure 4:
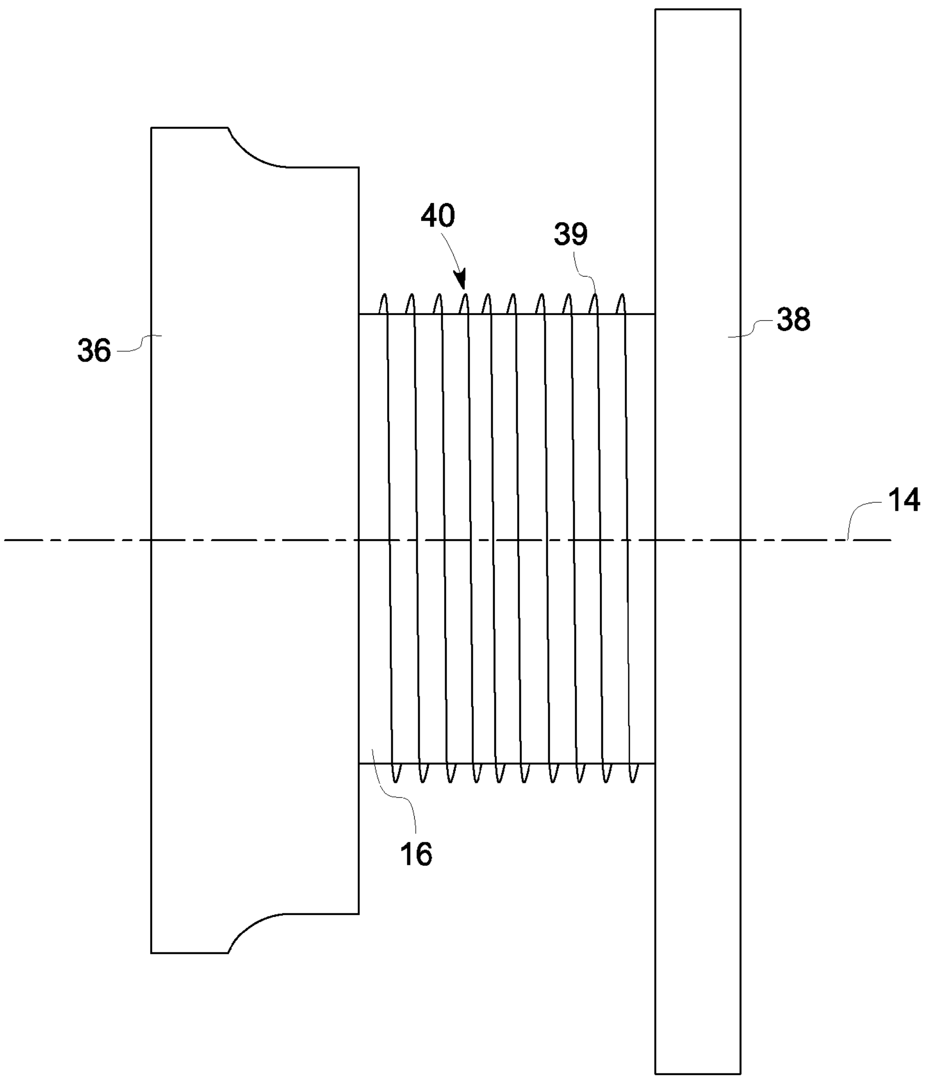
FIGS. 4-8 illustrate steps of fabricating a superconducting magnet assembly according to one embodiment.

In certain embodiments, a method of fabricating a superconducting magnet assembly is illustrated through FIGS. 4-7. Referring to FIG. 4, the bobbin 16 is properly positioned by fixing font and rear ends thereof to a first and a second flanges 36, 38. A superconducting coil 39 is helically wound on the outer peripheral of the bobbin 16 into a plurality of winding turns. An epoxy is applied to bond the winding turns together as a first superconducting coil layer 40.

Figure 5:
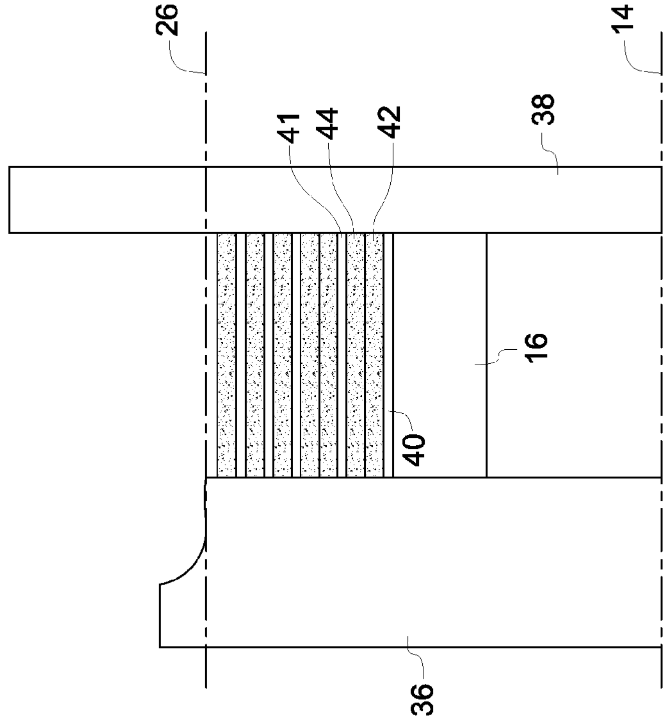

Referring to FIG. 5, a plurality of superconducting layers and a plurality of supporting member layers are wound on the first superconducting coil layer 40 layer by layer. For purpose of simplification, only the upper part of the unfinished assembly during fabrication is shown in FIGS. 5-9, and the lower part is omitted for being symmetrical about the central axis with the upper part. It is understood that the illustrated views are very exaggerated for purposes of illustration and is not drawn to scale.

In the illustrated embodiment of FIG. 5, a first supporting member layer 42, is wrapped on the first superconducting coil layer 40. In one embodiment, the first supporting member layer 42 is a fiber-glass sheet. In the illustrated embodiment, a second supporting member layer 44 is wound on the first supporting member layer 42 for reinforcing the stiffness of the superconducting assembly 10 and for reducing current density at the first superconducting coil layer 40. In an alternative embodiment, more than two supporting layers may be formed on the first superconducting coil layer 40. In the illustrated embodiment, more layers of superconducting coil layers and supporting member layers are alternatively wound layer by layer.

Figure 6:
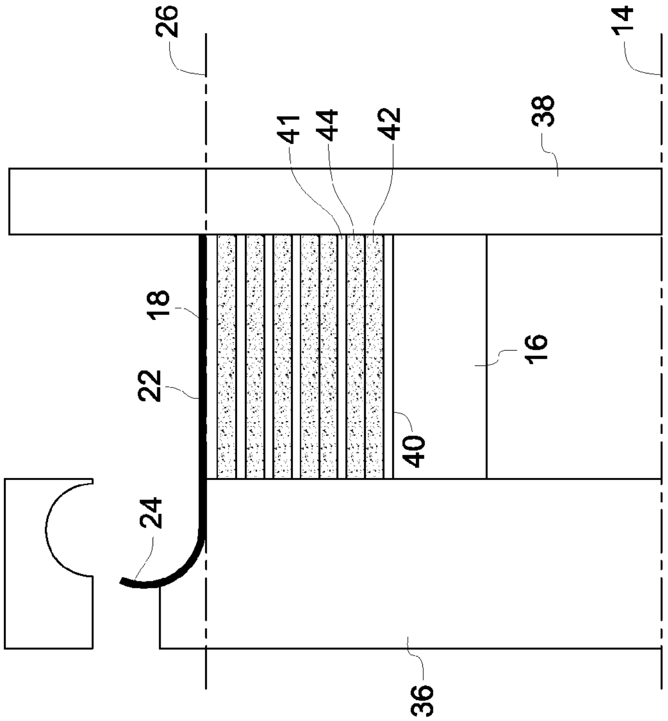

Referring to FIG. 6, in the illustrated embodiment, a thermal conduction member 22 such as a copper sheet shown in FIG. 3 is wrapped on one superconducting coil layer 18, and the thermal conduction layer 22 is substantially coincident with the middle circumference plane 26. In the illustrated embodiment, the circumference joint portion 24 of the thermal conduction layer 22 extends beyond front ends of the superconducting coil layer 18.

Figure 7:
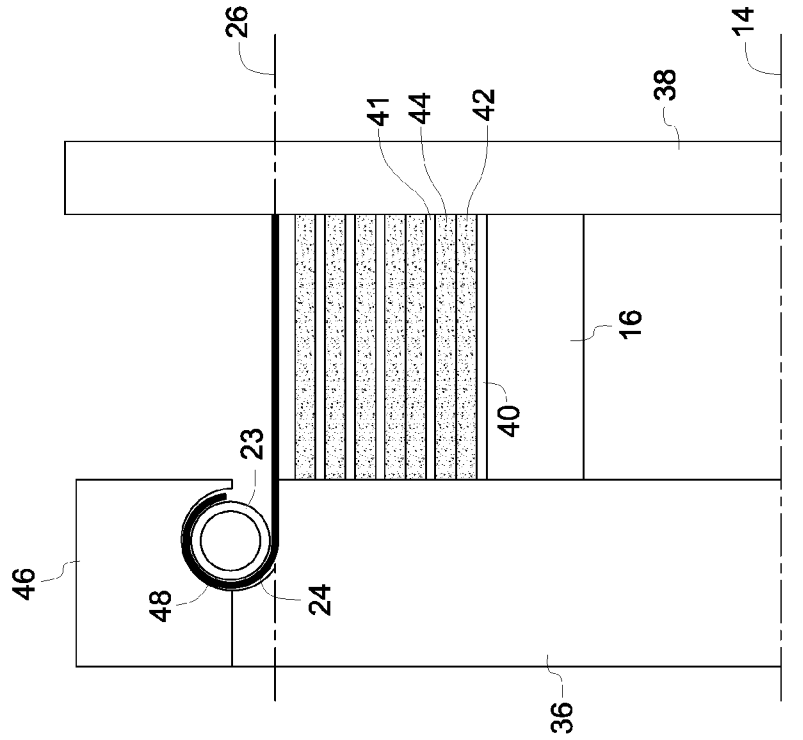

Referring to FIG. 7, in the illustrated embodiment, the cooling member 23, which is a cooling tube, is placed on the joint portion 24 of the thermal conduction member 22. The joint portion 24 is curved along an outer surface of the cooling member 23 and wrapped on the cooling member 23. Accordingly, a large thermal conduction area between the thermal conduction member and the cooling member 23 is obtained. In one embodiment, epoxy is applied for bonding the cooling member 23 in the circular channel of the joint portion 24. In another embodiment, the cooling member 23 is soldered or welded to the joint portion 24.

In the illustrated embodiment, the first flange 36 comprises a concave upper portion for supporting a lower portion of the joint portion 24. In the illustrated embodiment, a holding segment 46 is placed on the joint portion 24 after the cooling member 23 has been positioned in the joint portion 24. In the illustrated embodiment, the holding segment 46 has a lower surface matching an upper portion of the first flange 38. The first flange 36 and the holding segment 46 together define a groove 48 for holding the joint portion 24 and the cooling member 23 therein.

Figure 8:
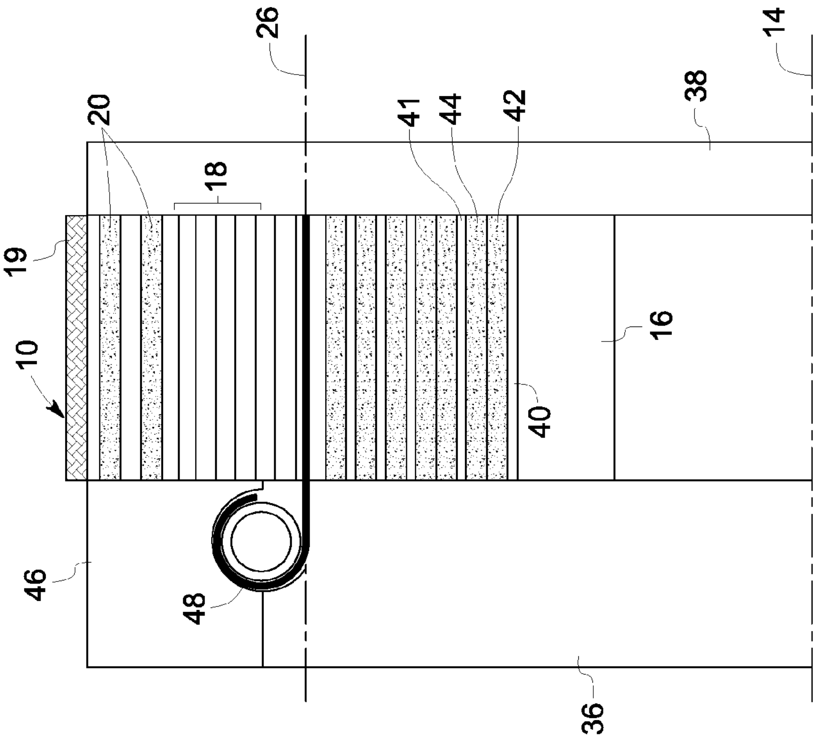

Referring to FIG. 8, a plurality of superconducting coil layers 18 and supporting member layers 20 are wound layer by layer on the thermal conduction layer 22. In the illustrated embodiment, the protection layer 19 is wound as an outermost layer. After the superconducting magnet assembly 10 is cured, the first and second flanges 36,38, the holding segment 46, and the bobbin 16 are removed, and the superconducting magnet assembly 10 is finished.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. The various features described, as well as other known equivalents for each feature, can be mixed and matched by one of ordinary skill in this art to construct additional systems and techniques in accordance with principles of this disclosure.

What is claimed is:

1. A superconducting magnet assembly comprising:

a bobbin comprising a central bore along a longitudinal direction; and a superconducting coil package wound on the bobbin, the superconducting coil package comprising:

a plurality of superconducting coil layers wound on the bobbin;

a plurality of supporting member layers, each of the supporting member layers being between a corresponding two adjacent superconducting coil layers; and a thermal conduction layer between two superconducting coil layers or between a superconducting coil layer and an adjacent supporting member layer, and wherein the thermal conduction layer is flexible along a circumferential direction of the assembly.

2. The assembly of claim 1, wherein the supporting member layer comprises a fiber-glass material.

3. The assembly of claim 1, wherein the superconducting coil package comprises a first and a second superconducting coil layer which are the closest to the bobbin with respect to other superconducting coil layers, and wherein the assembly comprises at least two supporting member layers between the first and second superconducting coil layers.

4. The assembly of claim 1, wherein the thermal conduction member comprises copper, aluminum, or ceramic materials.

5. The assembly of claim 1, wherein the thermal conduction member comprising a thermal conductive sheet comprising a plurality of strips extending along the circumferential direction of the assembly, and a plurality of slits each between two adjacent strips.

6. The assembly of claim 1, wherein the thermal conduction member comprises a plurality of copper or aluminum cables along the longitudinal direction of the assembly.

7. The assembly of claim 1, wherein the thermal conduction member comprises a circumferential joint portion extending beyond the adjacent superconducting coil layer in the longitudinal direction, and wherein the assembly further comprises a cooling member in thermal conduction with the circumferential joint portion of the thermal conduction member.

8. The assembly of claim 7, wherein the cooling member is a cooling tube in thermal contact with the joint portion along a circumferential direction of the assembly.

9. The assembly of claim 8, wherein the joint portion has an inner surface contacting an outer surface of the cooling tube.

10. The assembly of claim 1, wherein the thermal conduction layer is located substantially midway between the bobbin and the outermost layer of the superconducting coil package when measured in a radial direction of the assembly.

11. A method comprising:

winding a plurality of superconducting coil layers on a bobbin;

winding a plurality of supporting member layers each between a corresponding two adjacent superconducting coil layers; and winding a thermal conduction member between two adjacent superconducting coil layers, wherein the thermal conduction member is flexible along a circumferential direction of the assembly.

12. The method of claim 11, wherein winding a plurality of supporting members comprises winding a plurality of fiberglass plates between superconducting coil layers.

13. The method of claim 11, wherein winding a plurality of superconducting coil layers comprises winding a first and a second superconducting coil layer which are the closest to the bobbin, and wherein winding a plurality of supporting member layers comprises winding a first and a second supporting member layer between the first and second superconducting coil layers.

14. The method of claim 11, wherein winding a thermal conduction member comprises placing a thermal conductive sheet having a plurality of strips along a longitudinal direction of the assembly.

15. The method of claim 11 further comprising thermally coupling a cooling member to the thermal conduction member along a circumferential direction.

16. The method of claim 15, wherein the cooling member is a cooling tube, and wherein the method further comprises transmitting a liquid cryogen in the cooling tube.

17. The method of claim 15, wherein thermally coupling the cooling member to the thermal conduction member comprises wrapping a joint portion of the thermal conduction member around an outer surface of the cooling member.

18. The method of claim 17 further comprising positioning the bobbin on a first and a second flanges, wherein one of the first and second flanges comprises a concave upper surface supporting a lower portion of the joint portion.

19. The method of claim 18 further comprising placing a holding segment on the joint portion after the thermal conduction member is coupled to the joint portion, and wherein the holding segment and the concave upper surface of said one of the first and second flanges forms a groove receiving the joint portion and the cooling member therein.

* * * * *